United States Patent [19]

Turner et al.

[11] Patent Number: 4,761,768
[45] Date of Patent: Aug. 2, 1988

[54] PROGRAMMABLE LOGIC DEVICE

[75] Inventors: John E. Turner; David L. Rutledge, both of Beaverton, Oreg.

[73] Assignee: Lattice Semiconductor Corporation, Hillsboro, Oreg.

[21] Appl. No.: 707,662

[22] Filed: Mar. 4, 1985

[51] Int. Cl.[4] .................... H03K 19/177; G06F 11/26
[52] U.S. Cl. .................................... 365/201; 371/25; 364/716
[58] Field of Search ..................... 371/21, 25; 365/185, 365/201; 340/825.87, 825.79, 825.8, 825.83, 825.89, 825.90; 307/465, 468; 357/23.5; 364/716

[56] References Cited

U.S. PATENT DOCUMENTS

| | | | |
|---|---|---|---|
| 3,191,151 | 6/1965 | Price | 340/825.84 |
| 3,566,153 | 2/1971 | Spencer | 307/460 |
| 3,774,171 | 11/1973 | Regitz | 365/94 |
| 3,803,587 | 4/1974 | Mead | 340/801 |
| 3,816,725 | 6/1974 | Greer | 364/716 |
| 3,818,252 | 6/1974 | Chiba et al. | 307/303 |
| 3,818,452 | 6/1974 | Greer | 340/825.83 |
| 3,849,638 | 11/1974 | Greer | 364/716 |
| 3,906,255 | 9/1975 | Mensch, Jr. | 307/448 |
| 3,912,947 | 10/1975 | Buchanan | 307/269 |
| 3,924,243 | 12/1975 | Vermuelen | 364/900 |
| 3,936,812 | 2/1976 | Cox et al. | 365/63 |
| 3,949,370 | 4/1976 | Reyling, Jr. et al. | 364/200 |
| 3,974,366 | 8/1976 | Hebenstreit | 307/468 |
| 4,037,089 | 7/1977 | Horninger | 235/152 |
| 4,041,459 | 8/1977 | Horninger | 340/825.85 |
| 4,084,152 | 4/1978 | Long et al. | 340/825.87 |
| 4,091,359 | 5/1978 | Rossler | 340/825.87 |
| 4,124,899 | 11/1978 | Birkner et al. | 364/716 |
| 4,177,452 | 12/1979 | Balasubramanian et al. | 365/72 |
| 4,233,526 | 11/1980 | Kurogi et al. | 307/238.8 |
| 4,314,360 | 2/1982 | Higuchi et al. | 365/203 |
| 4,321,695 | 3/1982 | Redwine et al. | 365/185 X |
| 4,414,665 | 11/1983 | Kimura et al. | 371/21 |
| 4,434,478 | 2/1984 | Cook et al. | 365/185 |
| 4,441,074 | 4/1984 | Bockett-Pugh et al. | 371/25 X |
| 4,476,560 | 10/1984 | Miller et al. | 371/15 |
| 4,488,267 | 12/1984 | Harrison | 365/201 |
| 4,490,812 | 12/1984 | Guterman | 364/900 |
| 4,503,387 | 3/1985 | Rutledge et al. | 324/73 R |
| 4,521,852 | 6/1985 | Guttag | 364/200 |
| 4,521,853 | 6/1985 | Guttag | 364/200 |
| 4,543,646 | 9/1985 | Ambrosius, III et al. | 364/900 |
| 4,583,196 | 4/1986 | Koo | 364/900 |
| 4,590,552 | 5/1986 | Guttag et al. | 364/200 |
| 4,609,986 | 9/1986 | Hartmann et al. | 364/200 |
| 4,617,479 | 10/1986 | Hartmann et al. | 307/465 |
| 4,625,311 | 11/1986 | Fitzpatrick et al. | 371/15 |
| 4,638,189 | 1/1987 | Geannopoulos et al. | 307/465 |

FOREIGN PATENT DOCUMENTS 0196771 10/1986 European Pat. Off. .
0137933 10/1979 Japan .
1444084 6/1972 United Kingdom .

OTHER PUBLICATIONS

A. Scheibe et al., "A Two-Transistor SIMOS EAROM Cell", IEEE Journal of Solid-State Circuits, vol. SC-15, No. 3, Jun. 1980, pp. 353-357.

(List continued on next page.)

Primary Examiner—Joseph A. Popek
Attorney, Agent, or Firm—Roberts and Quiogue

[57] ABSTRACT

An improved programmable logic device (PLD) is disclosed which employs electrically erasable memory cells which can be programmed and erased at high speed. The PLD memory cells comprise floating gate transistors as the storage elements, which are programmed and erased by Fowler-Nordheim tunneling. The PLD includes a serial register latch (SRL) which is coupled to the product terms of the PLD array. Input programming data for a selected row of the array is serially entered into the SRL, and during a programming cycle the SRL data is employed to simultaneously program the storage elements of the selected row to either the enhancement mode or the depletion mode. The data programmed into the array may be verified at high speed. The status of each of the cells in the selected row can be sensed using the normal sense amplifiers and loaded into the SRL in parallel, and thereafter serially shifted out of the PLD for external verification. The PLD output logic and sense amplifiers can be functionally validated independent of the data in the array. Test data such as apparent array patterns are serially loaded into the SRL, and thereafter forced onto the normal sense amplifier inputs, propagated through the output logic and read out of the device output pin.

25 Claims, 9 Drawing Sheets

OTHER PUBLICATIONS

"An Introduction to Array Logic," H. Fleisher, L. I. Maissel, IBM Journal of Research and Development, Mar. 1975, pp. 98 et seq.

"Array Logic Macros," J. W. Jones, IBM Journal of Research and Development, Mar. 1975, pp. 120 et seq.

"PLAs Replace ROMs for Logic Designs," Electronic Designs 22, Oct. 15, 1973.

"A High Speed ESFI SOS Programmable Logic Array with an MNOS Version," IEEE Journal of Solid State Circuits, vol. SC-10, No. 5, Oct. 1975, pp. 331-336.

IEEE Journal of Solid-State Circuits, vol. SC-16, No. 5, Oct. 1981, pp. 570-577, New York, U.S.; R. A. Wood et al.: "An Electrically Alterable PLA for Fast Turnaround-Time VLSI Development Hardware".

Electronics, vol. 53, No. 5, Feb. 1980, pp. 113-117, New York, U.S.; W. S. Johnson et al.: "16-K EE-PROM Relies on Tunneling for Byte-Erasable Program Storage".

IEEE Journal of Solid-State Circuits, vol. SC-19, No. 6, Dec. 1984, pp. 1041-1043, New York, U.S.; E. Fong et al.: "An Electrically Reconfigurable Programmable Logic Array Using A CMOS/DMOS Technology".

IEEE International Solid-State Circuits Conference, vol. 28, 32nd Conference, Feb. 1985, pp. 130-131, 322-323, Coral Gables, Florida, U.S., R. Leung et al., "A 50ns 48-Term Erasable Programmable Logic Array".

IEEE Journal of Solid-State Circuits, vol. SD-10, No. 5, Oct. 1975, pp. 331-336, New York, U.S.; K. Horninger, "A High-Speed ESFI SOS Programmable Logic Array with an MNOS Version".

ONDE Electrique, vol. 63, No. 4, Apr. 1983, pp. 33-41, Paris, FR; P. Roux et al.; "Les Memoires Non Volatiles Electriquement Reprogrammables, Bilan et Perspectives".

"Programmable Logic Array Decoding Technique," F. E. Howley, J. W. Jones, IBM Technical Disclosure Bulletin, vol. 17, No. 10, Mar. 1975.

"Field-PLAs Simplify Logic Designs," Electronic Design, Sep. 1, 1975.

"Programmable Logic Array," *MOS/LSI Design and Application,* W. Carr et al., pp. 255 et seq.

"Altera EP 300 Erasable Programmable Logic Device," by Altera Corporation, Santa Clara, CA, 95051, Copyright © 1984, pp. 1-12.

"Automatic Page Write * * * Data Poling," vol. 1, No. 2, Jul. 23, 1983, by Reggie Huff.

Monolithic Memories Advance Information Data Sheet for "PAL64R32 HAL64R32 High Density Programmable Array Logic Devices".

Data Sheet entitled, "Product Specification Am27256 32,768×8-Bit Erasable PROM Advanced Micro Devices", Jul. 1983, pp. 1-6.

Pp. 3-4, 3-10 and 3-19-3-22 Monolithic Memories, Inc., Product Data Book "20-Pin PAL/HAL".

*Characteristics and Operation of MOS Field Effect Devices,* Richman, McGraw-Hill, Inc., 1967, pp. 114-118.

PROGRAMMABLE LOGIC DEVICE

BACKGROUND OF THE INVENTION

The present invention relates to programmable logic devices, and more particularly to techniques for providing high speed programming and verification of device array programming data and logic paths.

Digital systems such as computers typically are fabricated from many logic and memory integrated circuits or chips. A goal of microelectronic integration is to fit the memory and logic circuits of a system onto the fewest possible integrated circuits, to minimize the cost and increase the system speed and reliability.

Useful memories are relatively easy to define, but logic circuits present a problem to integrated circuit manufacturers, who cannot afford to make logic integrated circuits which are perfectly tailored to the specific needs of every customer. Instead, generally purpose VLSI circuits are defined which can serve as many roles as possible. For example, the microprocessor allows logic functions to be expressed in software, and together with memory units and standard peripheral is capable of consolidating much of the logic in a digital system. However, random logic circuits are still required to tie these elements of the the system together.

Several schemes are used to implement these random Logic circuits. One solution is standard logic, such as transistor-transistor logic (TTL). TTL integrated circuits are versatile because they integrate only a relatively small number of commonly used logic functions. The drawback is number of commonly used logic functions. The drawback is that large numbers of TTL integrated circuits are typically required for a specific application, increasing the consumption of power and board space, and driving up the overall cost of the digital system.

Other alternatives include fully custom logic integrated circuits and semi-custom logic integrated circuits, such as gate arrays. Custom logic circuits, precisely tailored to the needs of a specific application, allow the implementation of specific circuit architectures, dramatically reducing the number of parts required for a system. However, custom logic devices require significantly greater engineering time and effort, which increases the cost to develop these circuits and may also delay the production of the end system.

Semi-custom gate arrays are less expensive to develop and offer faster turnaround because the circuits are typically identically except for a few final-stage steps, which are customized according to the system design specifically. However, semi-custom gate arrays are less dense, so that it takes more gate array circuits than custom circuits to implement a given amount of random logic.

Between the extremes of general purpose devices on the one hand and custom and semi-custom gate arrays on the other, are programmable logic devices (PLDs). PLDs provide a flexible architecture, user-programmed through on-chip fuses or switches, to perform specific functions for a give application. PLDs can be purchased "off the shelf" like standard logic gates, but can be custom tailored like gate arrays in a matter of minutes.

To use PLDs, system designers draft equations describing how the hardware is to perform, and enter the equations into a PLD programming machine. The unprogrammed PLDs are inserted into the machine, which interprets the equations and provides appropriate signals to the device to blow the the PLD which will perform the desired logic function in the user's system. The PLD typically includes hundreds of thousands of the fuses or switches, arranged in a matrix to facilitate their manufacture and programming.

Programmable logic devices ("PLDs") have historically been programmed one bit at a time in a serial fashion. The main reason for this approach is that the PLDs have predominantly been implemented in a bipolar technology which requires high currents (on the order of 30 mA) to program bits of data. Programming many bits in parallel would produce destructive power dissipation.

Recently, PLDs based on erasable-programmable-read-only memory cells (EPROMs) fabricated with CMOS (complimentary-metal-oxide-semiconductor) technology have been introduced. Such devices employ floating gate transistors as the PLD switches, which are programmed by hot electron effects. The EPROM cells are erased by exposure to ultraviolet light, which is quite time consuming. Another disadvantage of EPROM-based PLDs is the relatively high expense of the device packaging, which is driven up by the high cost of the quartz window provided to pass the ultraviolet light.

At least one EPROM-based PLD on the market today is apparently adapted for "byte" programming wherein eight programmable connections are programmed simultaneously. These devices would appear to still dissipate too much power to successfully program a large number of cells of parallel, since each bit requires from 2 to 10 mA of current for programming. The data is programmed by selecting a row address and a column address, and presenting the eight bits of data to be programmed to the device outputs. A reasonable upper limit on successful parallel programming is currently eight bits for this technology.

The time needed to program the PLD is an important consideration. Bipolar PLDs will obtain typical programming times in the range of 0.5 to 5 seconds for a 1K by 8 bit array. EPROM-based PLDs will obtain typical programming times in the range of about 40 to 100 seconds for a 1K by 8 bit array if "single bit" programming is employed. If "byte" programming is employed, then the programming time is reduced to a typical range of about 5 to 15 seconds.

Another problem of known PLDs relates to verification of output logic paths. The typical PLD comprises a programmable array, followed by sense amplifiers, logic gates and output drivers eventually arriving at the device output. (The exact configuration will depend on the particular device.) A typical PLD output structure comprises an array, sense amplifers, an OR gate, and an output register, coupled to the device output pin. The output data at the output pin does not have a one-to-one correlation to data on a specific product term or column of the array, as is the case for a memory. The typical way to determine if the output devices are working properly is to program the array with a bit pattern and test to see if the output logic is working. Because bipolar fuses are destructively programmed, it is not possible to verify operation of all the output devices. It is also known to provide a test input to an OR gate to test its functionality, but this does not verify operation of the sense amplifiers or other OR gate inputs.

It is known to provide the capability of high speed fuse verification, but insofar as applicant is aware, the known techniques employ separate verification sense amplifers, thereby providing a somewhat different verification signal path from the normal user signal path through the normal use sense amplifier. Thus, the known techniques do not verify operation of the normal use sense amplifers, which may be inoperative due to manufacturing defects. Moreover, the use of separate sense amplifiers, with possibly different sense thresholds can lead to different results, i.e., the fuse-verify sense amplifier may sense an open cell, but the normal logic sense amplifier may sense a closed cell.

It is therefore a principle object of the invention to provide a programmable logic device which may be programmed at very high speed.

Another object is to provide a PLD with the capability of high speed verification of the programmed data using the normal sense amplifiers.

A further object is to provide a PLD with the capability of verifying the operation of the device output logic devices.

Another object is to provide an improved PLD which requires lower power consumption and is reprogrammable by the manufacturer and the user.

Another object of the invention is to provide a PLD employing electrically erasable memory cells to store the programmed data.

SUMMARY OF THE INVENTION

A novel PLD is disclosed which employs electrically erasable memory cells which can be programmed or erased at high speed. In the preferred embodiment, the PLD memory cells comprise floating gate transistors as the sense elements, which are programmed and erased by Fowler-Norheim tunneling. In accordance with the invention, the PLD comprises a serial register latch (SRL) which is coupled to the product term lines of the logic array to be programmed. The input programming data is serially entered into the SRL by the programming machine at a relatively high clock rate. The SRL is adapted to store all the data to be programmed on a particular row of cells in the device array. Row address information is provided to select the particular row to be programmed with the data. A ten millisecond programming pulse in then applied to the array to program simultaneously all the cells in the selected row. Thus, for a 32 row by 64 column cell array, all 64 cells in one of the 32 rows are programmed simultaneously.

The invention is also useful for high speed verification of the array data, by using the SRL to shift data out of the array. The status of each of the cells in the selected row can be sensed using the normal sense amplifiers and loaded into the SRL in parallel, and thereafter serially shifted out for external verification.

The invention further allows each sense amplifier and output logic gates to be functionally validated independent of data in the array. Test data such as apparent array patterns are serially loaded into the SRL. Under the control of a logic test enable input, the data in the SRL is forced onto the sense amplifier inputs. This apparent array pattern is then sensed through the normal output logic comprising the sense amplifier, the logic gate and output buffer, and read out of the device output pin. Data can therefore be serially clocked out of the device, and verified against the logical output that was received on the device output pins. Thus, the invention allows the output logic to be validated independent of the data programmed in the device array.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The present invention comprises a novel programmable logic device employing electrically erasable, programmable memory cells, and adapted for high speed programming and verification. The following description is presented to enable any person skilled in the art to make and use the invention, and is provided in the context of a particular application and its requirements. In the following description, numerous specific details are set forth, such as circuit configurations, array cell circuits, signal timing diagrams and the like, in order to provide a thorough understanding of the invention. It will be obvious to one skilled in the art that the present invention may be practiced without these specific details. In other instances, well-known circuit details and steps are not described in detail so as not to obscure the invention.

Figure 1:
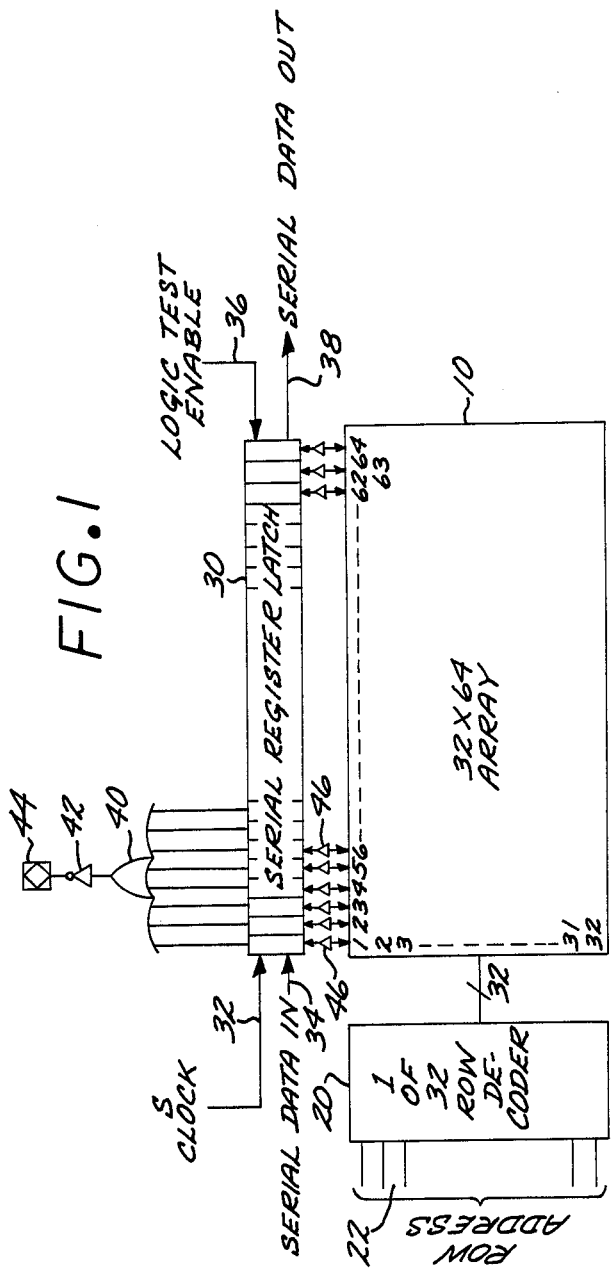
FIG. 1 is a simplified block diagram illustrative of the preferred embodiment.

Referring now to FIG. 1, a simplified block diagram illustrative of some of the principal features of the invention is disclosed. Exemplary array 10 comprises a 32 row by 64 column (or product term) array of programmable cells. The cells are individually programmable, in dependence upon the state of a programming bit presented to the cell during a programming mode.

In accordance with the invention, a 64 stage serial shift register latch (SRL) 30 is coupled to the array 10, such that individual stages 1-64 of the SRL are respectively coupled to corresponding columns 1-64 of the array 10. A 1-of-32 row decoder 20 is provided to select a particular row of the array during the programming cycle.

The SRL 30 comprises a clock port 32, a serial data input port 34, a "logic test enable" port 36 and a serial data output port 38. The individual 64 stages of the SRL are respectively coupled to the respective 64 product terms of the array 10. The 32 row lines of the array 10 are respectively coupled to the output of the 1-of-32 row decoder 20. The address of the row to be programmed during a particular program cycle is selected by the state of the row address gate (RAG) bus 22.

The clock rate of the clock signal applied to the SRL is nominally 1 Mhz. Thus, programming data may be serially shifted into the SRL from a programming machine or test head external to the logic device at the clock rate; to load the SRL with 64 bits of data requires less than one millisecond at the 1 Mhz clock rate. Once the SRL is loaded with programming instructions or data, then the SRL contents are programmed into the 64 cells of the selected row of the array 10 during a nominal ten millisecond programming cycle. The programming process is then repeated for each row of array 10 until the entire array has been programmed.

The invention thus allows the programming of the array 10 to be performed very quickly; the entire 32 by 64 cell array may be programmed in less than one-half second, as compared with over 20 seconds required for "single bit" programming of EPROM-based PLDs.

The preferred embodiment of the invention is implemented in CMOS technology, wherein the storage elements of each cell comprise electrically erasable programmable floating gate field effect transistors employing Fowler-Nordheim tunneling. The technique is extendable to any arbitrary number of columns, since these floating gate transistors require essentially zero current to program. Thus, programming time can be greatly reduced for PLDs employing the invention.

The invention provides the capability for high speed verification of the contents of the array 10. The SRL may be employed to verify the state of each of the array cells in a particular, selected row. This data is loaded into the SRL and can be serially shifted out of the SRL via the "serial data out" port 38. As will be apparent to those skilled in the art, the programming equipment may be readily adapted to compare the output data contents of the selected row with the desired data.

A further aspect of the invention is illustrated in FIG. 1. During a logic test mode, data is serially loaded into the SRL. Under the control of a special test input ("Logic test enable"), the data in the SRL is forced onto the sense amplifier inputs. This "apparent array pattern" is the sensed through the normal output logic and read out of the device output pin. Data can then be serially clocked out of the SRL and verified against the logical output that was received on the device output pins. This technique allows the output logic to be validated using the normal sense amplifers without having to program the array pattern into the device. This is a very powerful feature, as it allows the manufacturer to test virtually 100% of the output logic circuitry for each chip.

Figure 2:
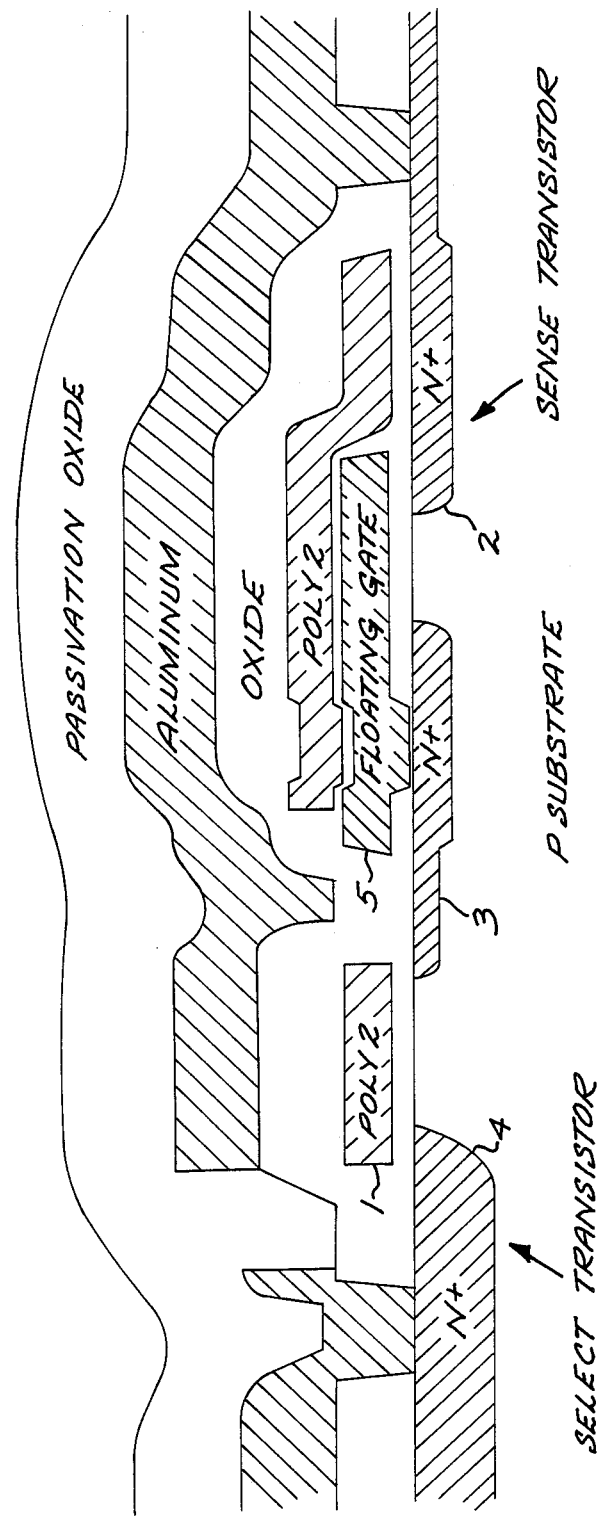
FIG. 2 is a simplified cross-sectional diagram illustrating the electrically erasable memory cell employed in the preferred embodiment in accordance with the invention.

FIG. 2 is a cross-sectional view of the electrically erasable memory cell employed in the preferred embodiment. The cell comprises a select transistor and a floating gate transistor as the sense or memory transistor. The floating gate device is adapted to employ the Fowler-Nordheim tunneling effect to remove or augment the charge stored on the floating gate to place the sense transistor in either the enhancement or depletion mode. To allow Fowler-Nordheim tunneling to take place, the floating gate region 5 is separated from the drain region, N+ region 3, by a very thin (100 Angstrom) layer of oxide.

The select transistor is formed by a polysilicon region 1, separated from the N+ regions 3,4 by an oxide layer. The polysilicon region 1 comprises the gate electrode of the select transistor, with the source and drain comprising the N+ regions 3,4 formed by N-type dopant implanted in the active area.

Programmable Logic Device—Normal Mode

Figure 3:
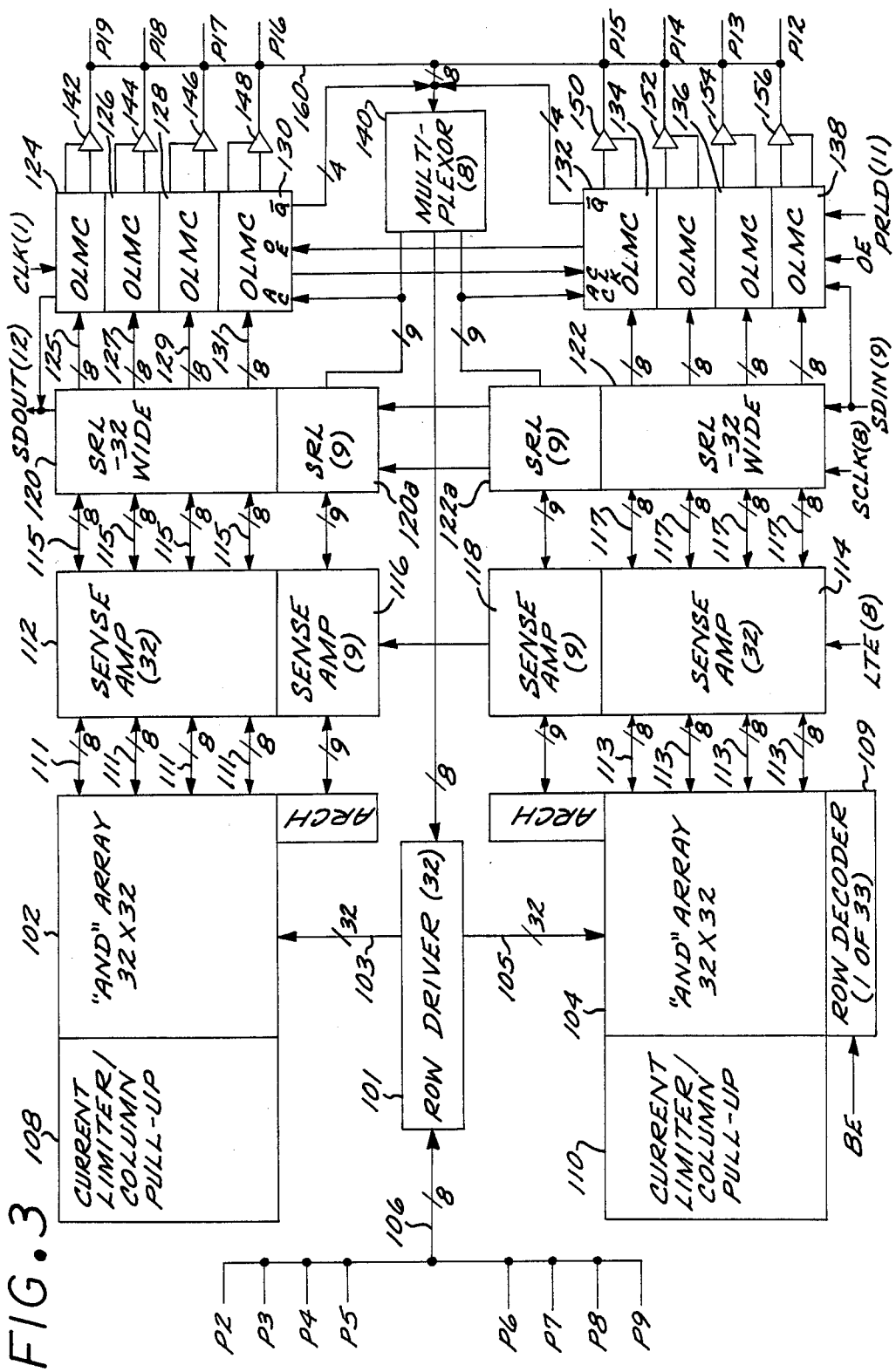
FIG. 3 is a block diagram of a programmable logic device employing the invention in its normal user mode.

Referring now to FIG. 3, a logic block diagram illustrative of a PLD employing the invention and in a normal user mode is disclosed. The preferred embodiment comprises an integrated circuit implemented in a CMOS technology. The physical layout of the circuit logic blocks of the PLD is generally indicated in FIG. 3. Thus, the 32 by 64 cell array of FIG. 1 is shown in FIG. 3 as two 32 by 32 subarrays 102,104. To achieve higher performance, the AND gate array has been split into two halves with row drivers driving both directions. This effectively reduces by a factor of four the polysilicon row line delay.

Figure 4A:
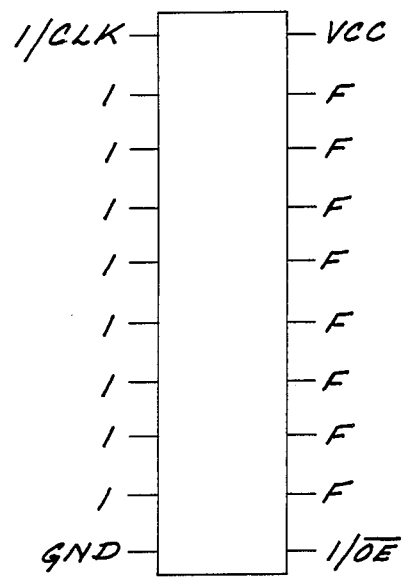
FIG. 4(a), 4(b) and 4(c) depict, respectively, the functional pin layout of the 20 pin package employed with the PLD of the preferred embodiment in the normal mode, the edit mode, and the logic test mode.
Figure 4C:
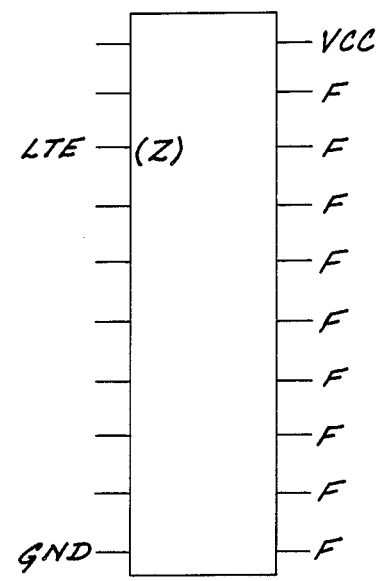
Figure 4B:
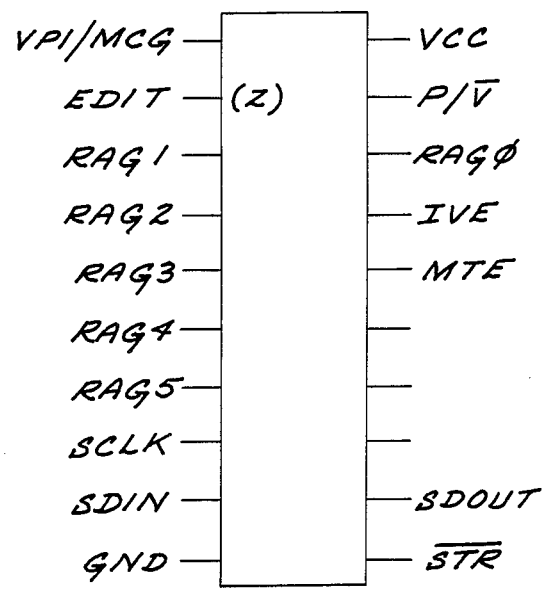

FIGS. 4(a), 4(b) and 4(c) illustrate the device functional pin layout in the normal mode (FIG. 4(a)) the edit mode (FIG. 4(b)) and the logic test mode (FIG. 4(c)). The preferred embodiment is housed in a 20-pin package with eight dedicated inputs (P2-P9) and eight user-programmable bi-directional pins (P12-P19). Pins P1 and P11 provide clock and output enable (CLK/OE) signals to the logic.

Figure 6:
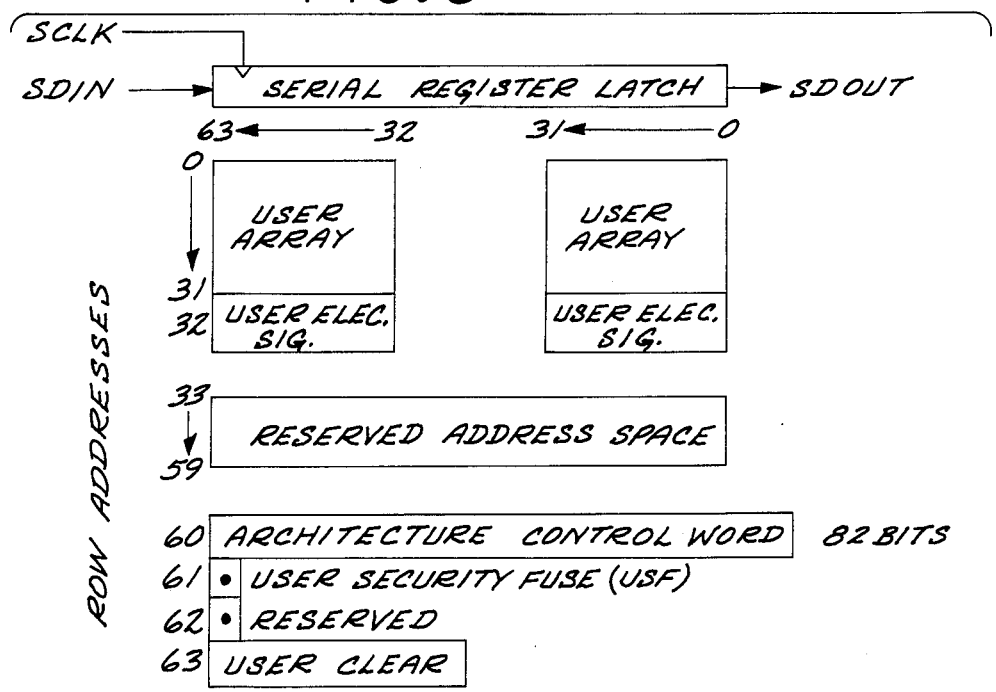
FIG. 6 is an illustration of the array configuration employed in the preferred embodiment.

While the size of the AND matrix available to the user for normal operation is 32 rows by 64 columns, the actual size of the matrix is larger to accommodate several other features of the device. Thus, FIG. 6 shows the actual array configuration employed in the preferred embodiment. Rows 0-32 comprise the user portion of the array. Rows 33-59 and 62 constitute reserved array space. Row 60 is 82 bits in length and defines the output logic architecture of the PLD.

During the normal user mode, pins P2-P9 are input ports and are coupled via bus 106 to row driver 101. In FIG. 3, the respective rows of arrays 102,104 are coupled to the row driver 101 by busses 103,105. One side of the respective columns of cells (or product terms) in the arrays is coupled to the current limiter and column pull-up circuits 108,110. The other side of the array columns are coupled to sense amplifiers 112,114 via busses 111,113, respectively. The sense amplifiers 112,114 are in turn coupled to 32 bit wide SRLs 120,122 via busses 115,117. To accommodate row 60 of the array which is 18 bits wider than the other rows of the array, 9 bit SRLs 120a,122a are selectively serially coupled to SRLs 120,122, and in a parallel fashion to sense amplifiers 116,118.

The SRLs 120,122 are in turn coupled to the output logic macrocells ("OLMC") 124,126,128,130,132,134,136,138. The respective OLMC outputs are coupled to respective output drivers 142,144,146,148,150,152,154,156. The 9 bit SRLs 120a,122a are coupled to multiplexor 140. Eight bit buss 160 couples the outputs of the output drivers to multiplexer 140, in turn coupled to the row driver 101. The output drivers are also coupled to output ports P12-P19.

Although not active during the normal user mode, the programming row decoder 109 is also illustrated in FIG. 3.

Figure 5:
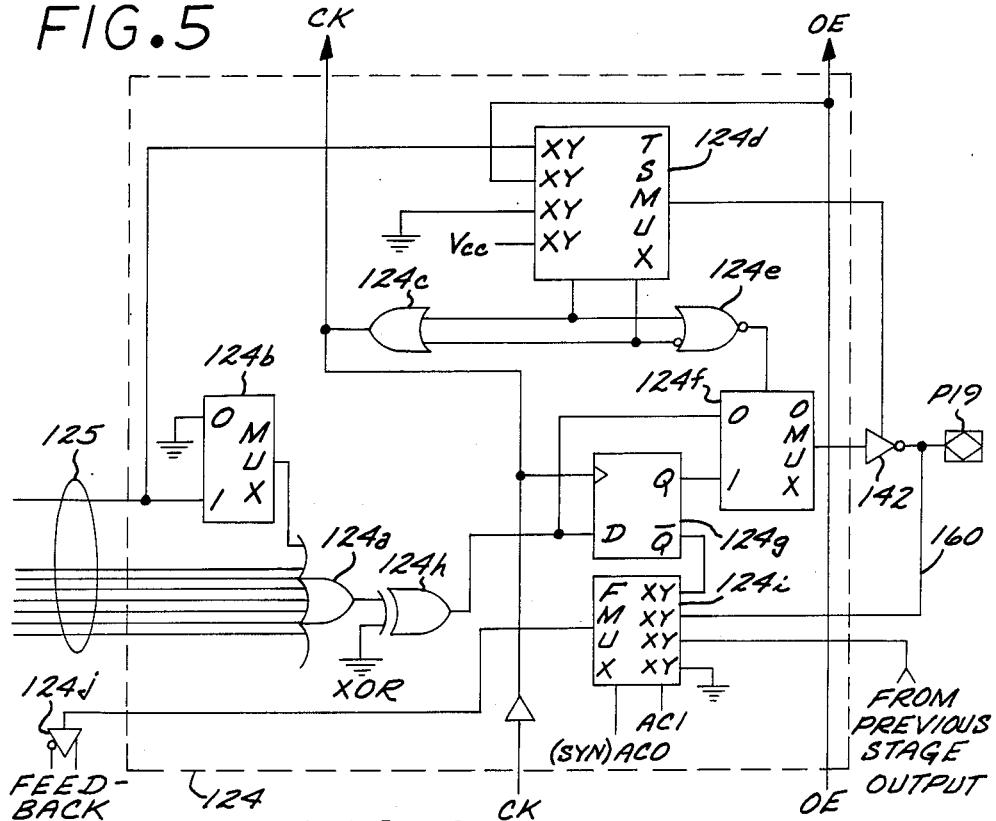
FIG. 5 is a simplified schematic drawing of an output logic macro cell as employed in the PLD.

FIG. 5 is a simplified schematic of a typical OLMC 124. In the normal user mode, eight bit buss 125 couples the outputs of eight sense amplifiers associated with eight product terms to the OLMC. The OLMC allows each device output signal to be individually set to active high or active low, with either combinational (asynchronous) or registered (synchronous) configurations. A common output enable (OE) can be connected to all outputs, or separate inputs or product terms can be used to provide individual output enable controls.

The various configurations of the PLD are controlled by programming bits within the 82 bit architecture control word. Architecture control bit AC0 and the eight AC1 bits direct the outputs to be wired always on, always off (as in input), have a common $\overline{OE}$ term (pin 11), or to be three-state controlled separately from a product term. The architecture control bits also determine the source of the array feedback term through multiplexer 124i, and select through multiplexer 124f either combinational or registered outputs. The eight XOR bits determine individually each device output polarity. The OLMC operation will be apparent to those skilled in the art, and need not be described in additional detail.

The PLD illustrated in FIGS. 3 and 5 is employed in a normal user mode wherein data input/output to the device I/O ports is passed through the device logic paths and operated upon by the particular logic devices which are active, to obtain the desired logic operations on the input signals.

PLD AND Array

The AND gate array is implemented in a non-volatile reprogrammable EEPROM type technology, which replaces the bipolar type "fuse." The basic cell of the user AND array comprises two transistors, the select and sense transistors; the cell is repeated 2048 times to make up the user programmable "AND" matrix organized as 32 input lines and 64 product terms.

Figure 7:
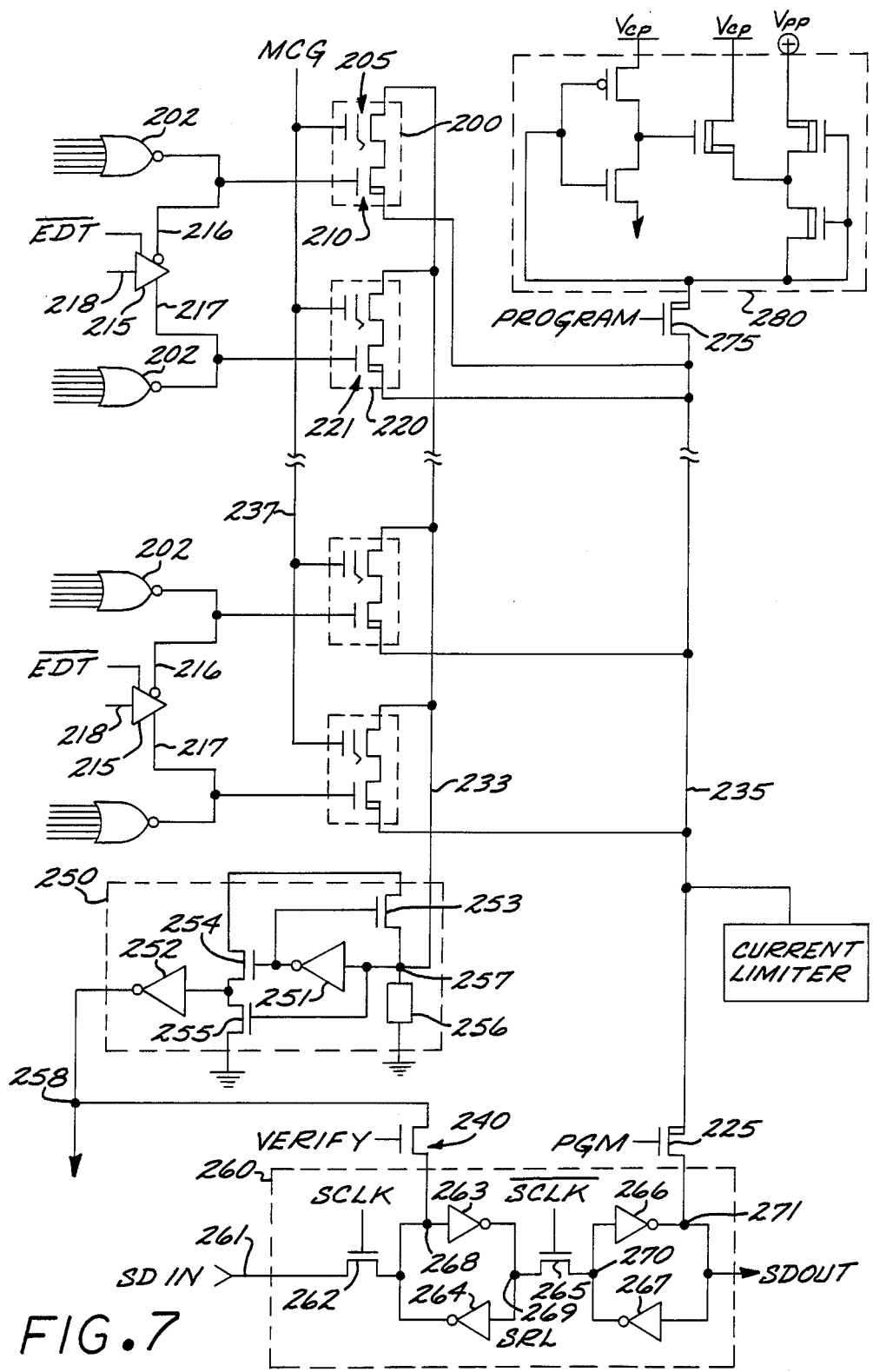
FIG. 7 is a simplified schematic illustrative of four cells of a product term or column of the AND array and programming and verification circuits of the preferred embodiment.

Referring now to FIG. 7, a simplified schematic of four cells of a product term comprising the subarrays 102,104 is disclosed. Line 233 comprises one of 64 product terms, and line 235 the product term ground line for the product term 233. During the normal user mode, line 235 is the grounded side of the device.

In the preferred embodiment, each product term comprises 32 cells coupled in parallel between the product term 233 and the product term ground line 235. Transistors 205,210 comprise one cell 200 coupled to product term 233. Transistor 210 comprises the "select" transistor or gate of the cell. In the normal user mode, the respective select transistors are gated by the input data, and selectively couple the respective sense transistor to the product term ground line. Input driver 215, for example, is gated by an input signal 218, and its true and compliment row driver signals on lines 217,216, respectively, drive the gates of select transistors 221,210. Thus, for example, if the input signal on line 218 is high, select transistor 221 will be turned on and select transistor 210 will be turned off.

In the device edit mode, the function of the "select" gates in a product term is to isolate predetermined ones of the sense transistors from the high programming voltage. For example, during the edit mode, only one of the 32 cells in a column is to be selected at any given time (except for "bulk" erasing or programming described below, in which the entire array is set to the same state). The selection is accomplished by row decoders 202, one of which is coupled to the gate of each select transistor of each cell. Pins 3-7 and 18 comprise the inputs to the row decoders, and select 1 of the 32 rows to be edited during a particular edit cycle.

The second transistor in each cell comprises the data storage (or sense) element for the cell. The transistor comprises an electrically erasable floating gate field effect transistor. The gate threshold turn-on voltage is about +8 volts when the device is in the enhancement mode, and about −5 volts when the device is in the depletion mode. Thus, for cell 200 shown in FIG. 7, during normal user operation, with a nominal interrogation voltage (+2.5 vols) on the matrix control gate ("MCG"), the floating gate transistor 205 will conduct when it has been programmed to the depletion mode; when the transistor is operating in the enhancement mode it does not conduct. Thus, during the normal user mode of the PLDs, the state of the sense transistors for each cell determines whether the corresponding input line for that row is coupled to the product term.

During the PLD edit mode, the input drivers 215 are disconnected from the array (by switches not shown) by the $\overline{EDT}$ signal and the row decoders are enabled. On the other hand, during normal PLD operation the row decoders 220 are disabled and have no effect on device operation.

The product term 233 is coupled to the input of sense amplifier 250. Amplifier 250 comprises inverters 251,252 and transistors 253–255. Load 256 provides a dc leakage path for the input node 257 of the sense amplifier to ground.

The output 258 of sense amplifier 250 is coupled to node 268 of SRL stage 260 by transistor 240, which is gated to the conductive state by the "VERIFY" signal. The product term ground line 235 is coupled to node 271 of SRL stage 260 by transistor 225, which is gated to the conductive state by the "PGM" signal.

The SRL stage 260 comprises inverters 263,264,266,267, and transistors 262,265 which are gated to the conductive state by the clock signal "SCLK" and inverted clock signal "$\overline{SCLK}$." Thus, data at the input 261 to the stage 260 will be inverted and propagated to node 269 when SCLK is high; $\overline{SCLK}$ is low during this time, and transistor 265 is non-conductive. When SCLK goes low, transistor 262 is turned off and $\overline{SCLK}$ goes high, turning on transistor 265. The input of the stage 260 is then isolated, and the inverted data is propagated through and inverted by inverter 266, so that the data present at node 261 during the clock signal is present at the output node 271. The data is latched at this node, through the operation of inverter 267, so long as transistor 262 is nonconductive. Shift register latches are known in the art; an exemplary reference is the paper entitled "A survey of Design for Testability Scan Techniques," by E. J. McCluskey, in VLSI Design, Dec., 1984.

The product term ground line 235 is also coupled to the column pull-up circuit 280 by transistor 275, which is gated to the conductive state by the "PROGRAM" signal. The pull-up circuit 280 is a high impedance voltage source adapted to generate a programming voltage (nominally +20 volts) high enough to program the floating gate transistors comprising the matrix cells. Such pull-up circuits are known in the art.

PLD Device Edit Mode

Figure 8:
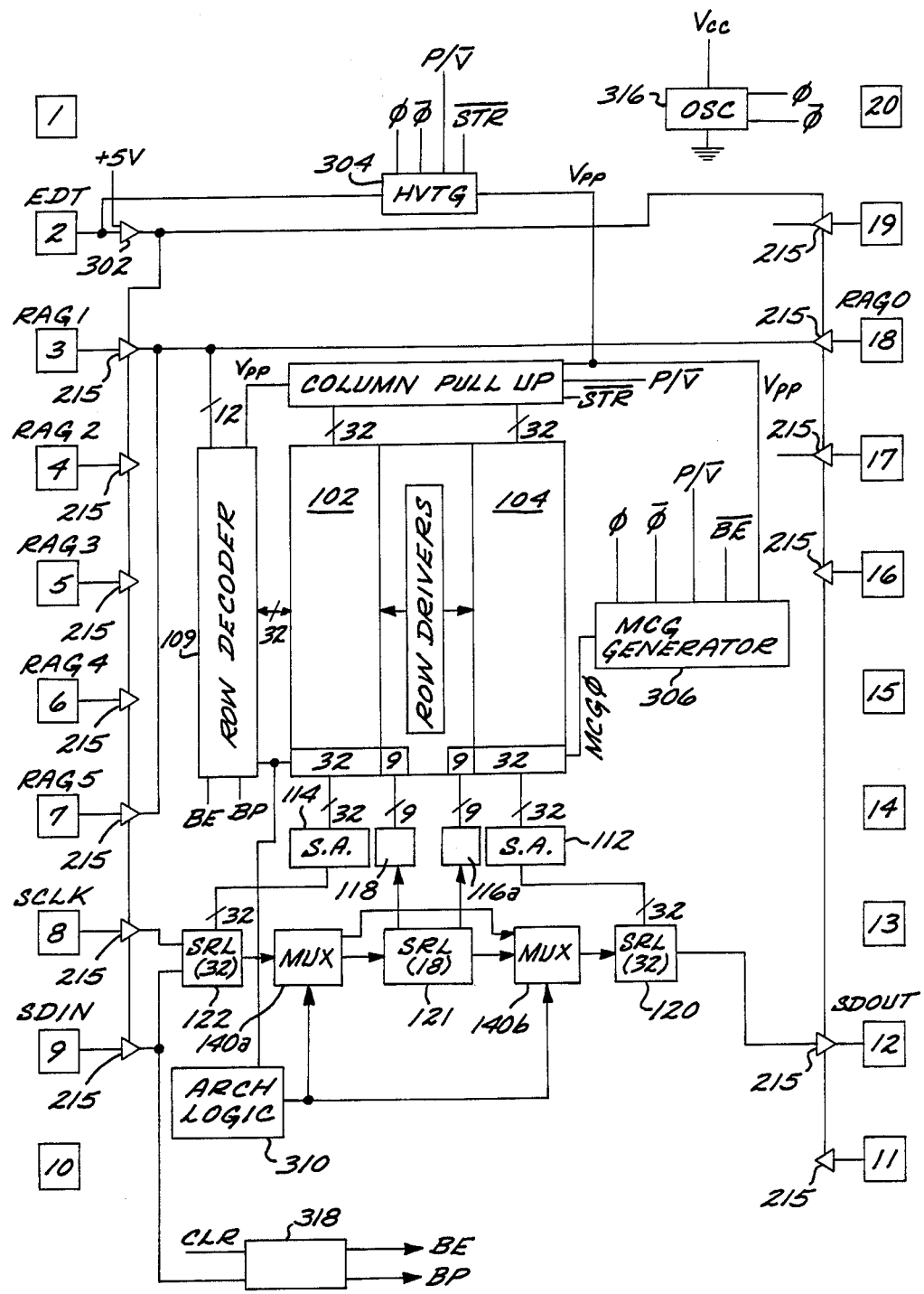
FIG. 8 is a simplified block diagram of a programmable logic device employing the invention when in the edit mode.

FIG. 8 is a simplified block diagram of the PLD when configured in the edit mode. When a super voltage, nominally 20 volts, is applied to pin 2 of the device, a super voltage sense circuit comprising comparator 302 senses the super voltage and issues logic signal "EDT." The pin 2 signal is also coupled to high voltage transfer gate 304, which gates "on" or "off" the programming voltage $V_{PP}$ (20 volts) in dependence on the state of the signals "P/$\overline{V}$" (pin 19) and "$\overline{STR}$" (pin 11). As is conventional, pump clock signals $\phi$ and $\overline{\phi}$ are internal oscillator outputs which are coupled to diode-capacitor pump circuits to generate high voltages which are used as gate signals to control gate 304 for passing high voltages. The active "EDT" signal also is coupled to the drivers 215, which are tristated by an active "EDT" signal. Thus, application of the super voltage to pin 2 reconfigures the PLD from the normal user mode to the edit mode, with different functions on all pins as shown in FIG. 4(b). The inputs to pins 3-7 and 18 serve as the selection bits for the row decoders 109 during the edit mode. In addition $V_{PP}$ is applied to the column pull-up, row decoders and to the matrix control gate generator 306, in dependence on the control bits to gate 304.

Like reference numbers are employed in FIG. 8 indicate corresponding elements to those shown in FIG. 3. Thus, the individual sense amplifiers for each product term are represented by amplifier sections 114,118,116a and 112. The stages of the SRL are grouped in 32 stage SRL section 122, 18 stage SRL section 121 and 32 stage SRL 120. Multiplexers 140a and 140b selectively couple serial data to or around 18 bit SRL section 121, in dependence on architecture logic circuit 310. Thus, the SRL section 121 is bypassed except when row 60 is to be accessed.

A "bulk erase" cycle is performed in the edit mode, whereby each of the floating gate transistors of the array cells is programmed into the enhancement mode. To bulk "erase" (or bulk program) the user array cells, a logical "CLR" signal is generated by selecting row 63. Logic circuit 318 is gated by the "CLR" signal and the data at the SDIN port and generates either the bulk erase control signal "BE" or the bulk program control signal "BP," in dependence on the data at the SDIN port. The CLR signal forces SCLK and $\overline{SCLK}$ both high, opening up the SRL registers to immediately propagate the data at the SDIN port through all stages of the SRL. This eliminates the need to clock the data through the registers, since the appropriate data of the same logic level are loaded into the SRL.

To bulk erase the cells, the appropriate data are loaded into the SRL, and the "MCG" line is raised to +20 volts. The logic signal $\overline{BE}$ is coupled to the MCG generator 306 to force the MCG signal to +20 volts when $\overline{BE}$ goes low. A normal programming cycle is then carried out to program all the memory cells to the erased state (enhancement mode).

Once the bulk erase cycle is completed, a programming cycle may be carried out. A particular row is enabled, and appropriate data are loaded into the SRL to either enable programming the particular sense transistors to the depletion mode or to inhibit such programming, leaving the particular sense transistor in the enhanced mode. After the SRL has been loaded with data, the "PGM" signal at the gate of transistor 225 may be activated, gating transistor 225 to the conductive state, "PROGRAM" is taken high (+20 volts) to connect the column pull-up to the product term ground. If the data signal at node 271 is low, then the product term ground line 235 is clamped to ground, because the "column pull-up circuit" comprises a high impedance voltage source and cannot supply enough current to raise the voltage level above ground. During the programming cycle, the MCG signal is grounded. Thus, the selected row cell has a ground potential applied to both the gate and the drain, and no potential is created across the gate/drain to cause tunneling of electrons from the floating gate. As a result, the floating gate transistor of the cell will remain in the enhancement mode.

If a "high" data signal is present at node 271 during the edit mode, the product term ground line will not be clamped to ground, and the high (20 volts $-V_T$) programming voltage from the column pull-up source will be applied to the drain of the selected floating gate transistor. Electrons will tunnel from the floating gate to the drain, programming the transistor to the depletion mode. This program voltage is nominally applied for ten milliseconds, a conventional programming pulse length.

To summarize the operation of the array during the programming cycle of the edit mode, the "MCG" signal is grounded, and transistor 225 turned on by a "PGM" signal applied to its gate. Only one of the 32 cells in the product term side has been activated, by application of a select signal to the select transistor to the cell to cause the select transistor to conduct. The data in the SRL is applied to the product term ground line. If the data signal is low, the product term ground line is grounded and the transistor remains in the enhancement mode, requiring an elevated gate voltage level to cause the transistor to conduct. During normal circuit operation, the normal cell interrogation voltage is low enough such that the floating gate transistor will not conduct when in the enhancement mode. On the other hand, if the data signal at node 271 of the SRL stage is "high," then a sufficient field will be impressed across the gate and drain to cause electrons to tunnel from the floating gate to the drain via the 100 Angstrom tunnel oxide, thereby programming the cell to the depletion mode.

Programmed Data Verification

Another novel aspect of the disclosed PLD is the capability of performing high speed verification of the data stored on the matrix cells. In this verification cycle, the same sense amplifiers used during normal user operation of the device are employed to sense the state of the array cells and to perform a parallel load of the SRL. During this mode, the "VERIFY" signal applied to the gate of transistor 240 (FIG. 7) is activated, so that transistor 240 conducts, coupling the output 258 of the sense amplifier 250 to node 268 of the corresponding stage of the SRL. At the same time, the "PGM" and "SCLK" signals are low, so that the stages of the SRL are isolated from each other and from the respective product term ground lines. With the $\overline{SCLK}$ signal high, the data signal at node 268 is propagated to the output node 271 of the SRL stage.

As with the programming cycle, only one cell in each column or product term line of the array is selected at any given time during the verification cycle. Thus, the data contents of an entire selected row of the matrix may be loaded in parallel into the respective SRL stages during the verification cycle. The "VERIFY" signal is then brought low to turn transistor 240 off and isolate the sense amplifiers from the SRL. The contents of the SRL may then be shifted serially out of the SDOUT port (pin 120 of the device for verification, by activation of the SRL clock signal SCLK. The PLD test head is adapted to perform the comparison between the outputted data and the desired data.

Logic Verification

Another novel feature of the PLD is its logic verification capability, allowing virtually 100% testing capability of the output logic circuits on the device in a non-destructive manner. To carry out the verification, at least one cell in each product term must be conductive. A "bulk program" operation may be employed placing all the floating gate transistors into the depletion mode. This is done by loading appropriate data into the device SDIN port in a manner analogous to that described for the bulk erase cycle. In the disclosed embodiment, row 63 is selected, and all row decoder outputs go high (in a user clear mode) to 20 volts to select all rows; the "MCG" signal is dropped to the ground potential. A normal programming cycle is then carried out.

Once the array has been bulk programmed to the conductive or "programmed" state, then "apparent array patterns" are serially loaded into the SRL, by selection of the edit mode as described above for the programming cycle. This desired pattern may be developed to verify a particular logic path through the sense amplifiers and output circuitry. To verify all the logic paths, it will normally be necessary to employ a plurality of apparent array patterns.

The device edit mode is then exited by removing the super voltage signal from pin 2, and the logic verification mode is entered. Application of a super voltage to pin 3 of the PLD selects the logic verification mode, and results in activation of the "PGM" signal applied to the gate of transistor 225, such that the transistor becomes conductive, and node 271 of the SRL stage is coutpled to the product term ground line 235.

To verify the logic paths, it is not necessary to program the array cells with the test bit pattern. Since at least one of the data storage transistors of the cells in a particular product term is in the conductive state, the logic state at node 270 of the SRL will, with transistor 225 in the conductive state, be forced onto the input of the sense amplifier 250. Transistor 240 is turned off in this mode. Thus, by comparing the "apparent array pattern" with the data at the PLD output pin, verification may be obtained of the logic paths.

To summarize the sequence of steps for the logic verification, at least one of the sense transistors per product term is programmed to the depletion mode. Then the PLD edit mode is entered, and the SRL is loaded with the desired pattern. Next, the PLD edit mode is exited, and the logic test mode is entered by applying a super voltage to a super voltage pin 3 of the PLD.

The logic verification capability also allows functional testing to be conducted after the device has been programmed, and without altering the user data which has been programmed into the array. At least one cell will have been programmed to the depletion mode for each usable product term during the programming cycle. Thus, the apparent bit pattern loaded into the SRL will be propagated through the conductive cell during the logic verification mode, and forced onto the input of the product term sense amplifier. Thus, the ouput logic may be tested, e.g., in the field, without reprogramming the device.

Device Waveform Timing

Figure 9:
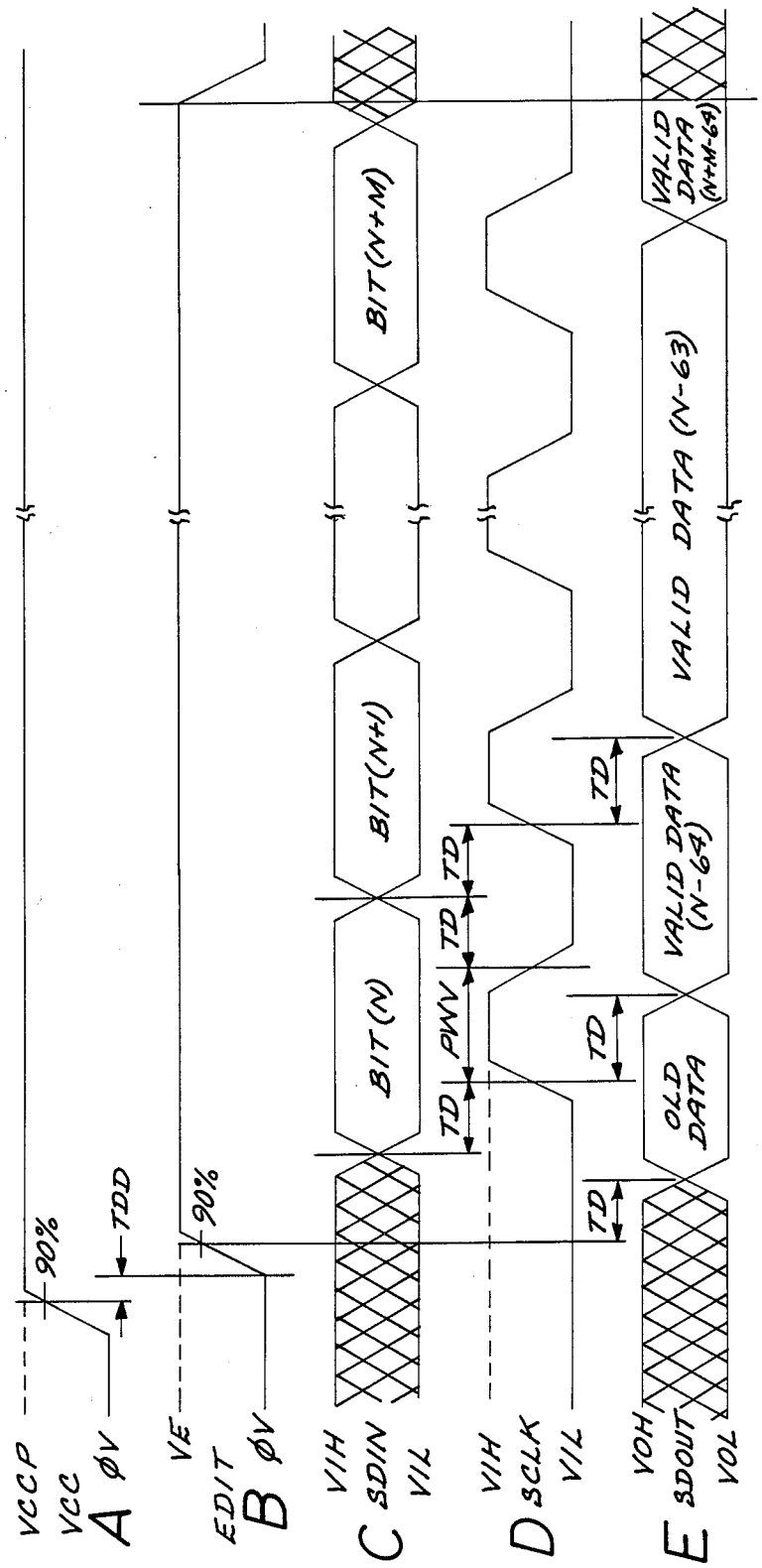
FIG. 9 is a timing diagram illustrative of the loading of programming data into the shift register latch.
Figure 11:
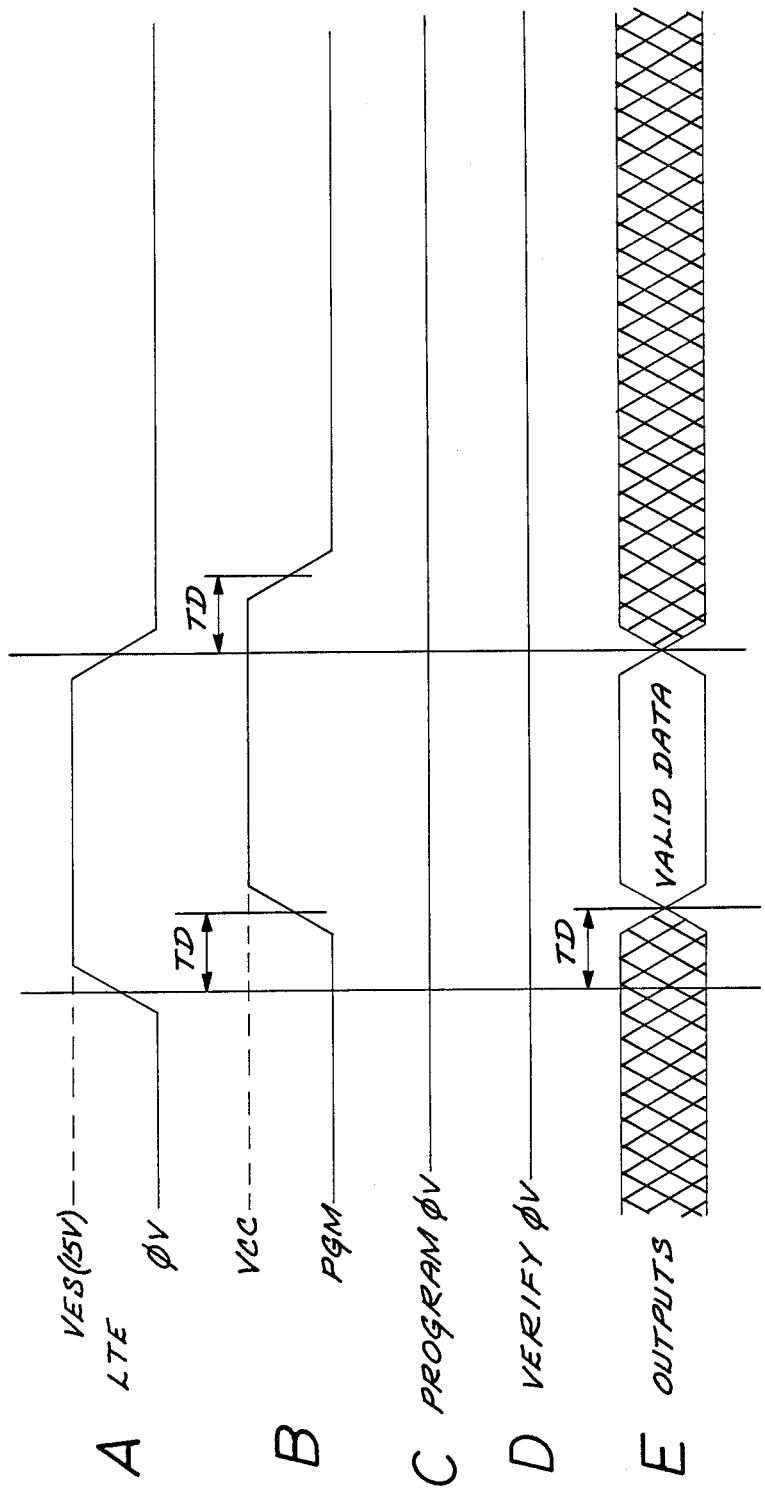
FIG. 11 is a signal timing diagram illustrating the logic test mode of the preferred embodiment.
Figure 10:
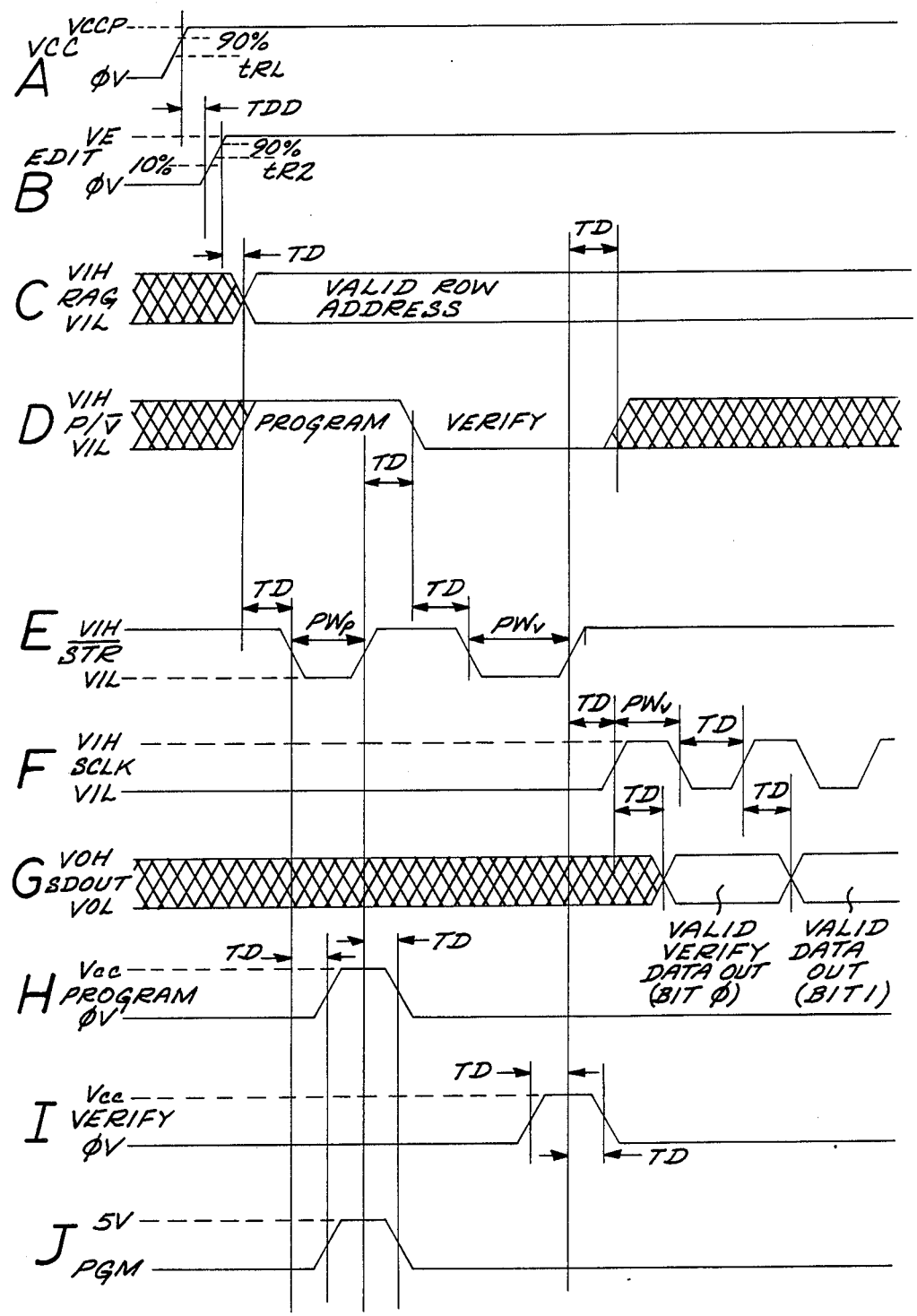
FIG. 10 is a timing diagram illustrating the programming and verification of data in the matrix.

Referring now to FIGS. 9-11, waveform timing diagrams are provided which are illustrative of the signal sequence for loading the SRL programming/verifying the array contents and verifying the operation of the output logic. To load the SRL with data, signal VCC (pin 20) is raised to VCCP, nominally 5 volts (FIG. 9(a)). After a time delay $T_{DD}$ to allow the VCC supply to settle, typically 20 microseconds, the device edit mode is entered by raising the EDIT signal applied to pin 2 from zero to VE, the edit/verify supply level, nominally 20 volts (FIG. 9(b)). The VCC and EDIT signals are held high during the SRL loading sequence (and during the array program/verify sequence as well.)

After the EDIT signal has settled, SDIN data is applied to, the serial data input port for the device in the edit mode (pin 9). The SDIN signal is illustrated in FIG. 9(c), and is loaded into the SRL at the clock rate determined by the SCLK clock signal shown in FIG. 9(d). The time intervals TD and PWV represents the pulse sequence delay and the verify pulse width ranging from 1 to 10 microseconds, nominally 5 microseconds. Thus, for each clock pulse, one bit of data is loaded into the SRL; FIG. 9(c) illustrates the loading of bits N through N+M.

FIG. 9(e) illustrates the SRL contents being serially unloaded from the device through the serial data output port, pin 12. The data is serially unloaded, with valid data present on the leading edge of the SCLK clock signal as illustrated in FIGS. 9(d) and 9(e). Serial data bits (N−64) through (N+M−64) are shown in FIG. 9(e).

Once the SRL has been loaded with the desired data, a selected device array row may then be programmed in accordance with the SRL contents; as illustrated in FIG. 10. VCC and EDIT are at their elevated levels, VCCP and VE, respectively (FIGS. 10(a), (b)). Next, a valid row address RAG0-RAG5 is presented to the row address gate ("RAG") ports (pins 18 and 3-7), to select the row of the matrix to be programmed with the SRL contents. In the edit mode, the matrix may be programmed with data from the SRL (the program cycle) and/or the matrix contents loaded into the SRL for verification (the data verification cycle), in dependence on the state of the "P/$\overline{V}$" control signal presented to pin 19. FIG. 10(d) illustrated the P/$\overline{V}$ signal in the "program" or high state, and in the inverted "verify" state, during different time intervals.

Once the valid row address has been provided, and the program/verify state determined, then the matrix program step is executed by bringing the $\overline{STR}$ signal (FIG. 10(e)) low for a program pulse width PWp, nominally 10 milliseconds. If the verify state is selected, STR need only be brought to the low state for a nominal verify pulse width of 5 microseconds to load the matrix data onto the SRL stages. FIGS. 10(d) and 10(c) illustrate the inter-relationship of P/$\overline{V}$ and $\overline{STR}$ for both the data programming and verification sequences.

Once the matrix data has been loaded into the SRL, the SRL contents may then be unloaded, after $\overline{STR}$ is brought to its normal high state to isolate the SRL from the product term sense amplifier. The clocking of data out of the SDOUT port of the device is illustrated in FIGS. 10(f) and 10(g). The VCC and EDIT signals remain in their high states during this operation.

FIG. 11 illustrates the signal waveforms during the logic test mode. As shown in FIG. 11(a), this mode is selected by raising the LTE signal at pin 3 to +15 volts. The PGM signal goes high (FIG. 11(b)), coupling the SRL to the product term ground line 235 though transistor 225. The PROGRAM and VERIFY signals are both low so that the SRL data is forced onto the sense amplifier and the output logic.

It is noted that logic circuitry internal to the PLD is adapted to generate the "VERIFY," "PGM" and "PROGRAM" gate control signals applied to the gate of transistors 225,240, and 275 of FIG. 7. These signals are determined by the $\overline{STR}$, P/$\overline{V}$, RAG signals, VCC and EDIT signals. Thus, for example, to obtain high "PROGRAM" and "PGM" signals requires P/$\overline{V}$ to be high and $\overline{STR}$ to be low. Circuitry to develop the appropriate "VERIFY," "PROGRAM," and "PGM" signals is omitted, for purposes of clarity, as those skilled in the art are readily able to design such circuitry.

It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

What is claimed is:

1. In an integrated programmable logic device comprising a plurality of input lines, a plurality of product terms, a matrix of programmable cells each selectively coupling respective ones of said input lines to respective ones of said product terms, and output logic circuits coupling said product terms to device terminals, the improvement wherein:

said programmable cells each comprise an electrically erasable and reprogrammable floating gate transistor having a source and a drain and employing Fowler-Nordheim tunneling to achieve charge transfer between the floating gate and the transistor drain so that the transistor may be operated in either the enhancement mode or the depletion mode, whereby the transistor is either conductive or nonconductive when an interrogation signal is applied to the gate of the floating gate transistor, and a cell select transistor connected in series relation with said floating gate transistor and whose state is controlled by a respective input line signal;

said device further comprises means for programming the floating gate transistors comprising said cells to either the enhancement mode or the depletion mode, said programming means adapted to program in parallel the cells coupled to a selected input line whose cell select transistors have been gated to the conductive state; and cell verification means for reading in parallel the programmed states of the respective cells coupled to a selected input line and providing a data sequence representative of respective programmed states at a device output port.

2. The improvement of claim 1 wherein said output logic circuits coupling said product terms to device terminals comprises means for performing a logical OR function on selected product term logical states.

3. An improved integrated programmable logic device, comprising:

a plurality of input lines coupled to device input ports;

a matrix of reprogrammable cells, each cell selectively coupling a particular input line to a respective product term;

a plurality of sense amplifiers, one each coupled to a respective product term for providing a sense amplifier logical state dependent on the logical states of those input lines selectively coupled to said respective product term;

output logic circuitry responsive to said respective sense amplifier logical states for providing device logical output signals at one or more device output terminals;

programming means for parallel programming in a single programming cycle the respective cells coupled to a selected input line in accordance with a predetermined programming data pattern; and cell verification means for reading in parallel the programmed states of the respective cells coupled to a selected input line and providing a data sequence representative of the respective programmed states at a device terminal.

4. The programmable logic device of claim 3 wherein said programming means includes (i) a serial shift register latch (SRL) comprising a plurality of series-connected stages, (ii) means for selectively coupling respective stages of said SRL to each cell associated with a corresponding product term, and (iii) means for serially entering data representative of said programming data pattern into said SRL via a serial input data port of the device.

5. The programmable logic device of claim 4 further comprising a serial data output port, and wherein the verification means comprises said SRL, means for coupling each of said stages to a corresponding one of said sense amplifiers, means for loading data representative of the state of respective cells of a selected row of said matrix into corresponding stages of said SRL, and means for thereafter serially shifting the contents of said SRL out of the serial data port of said device.

6. The programmable logic device of claim 4 further comprising output logic verification means for verifying the operation of said output logic, comprising means for inputting an apparent row pattern into said SRL, means for selectively coupling the respective stages of the SRL to the respective sense amplifiers to drive the respective sense amplifiers with said apparent row pattern, whereby the resulting device output bit pattern may be compared against an expected bit pattern.

7. An improved integrated programmable logic device, comprising:

a plurality of input lines;

a plurality of product term lines;

an array of nonvolatile electrically erasable and programmable switch elements, each coupled to a predetermined one of said input lines and said product term lines, and arranged to selectively couple said input line to said product term, or to isolate said input line from said product term, in dependence on the state of said switch element;

a plurality of sensing means, one each coupled to a respective one of said product terms, for sensing the logical state of said product term and providing a logical sense signal indicative of said logical state;

output logic circuitry responsive to said respective logical sense signals for providing device output signal at one or more device terminals; and verification means for verifying the operation of said sensing means and said output logic circuitry, said verification means comprising means for forcing an arbitrary, used-applied apparent array logical data pattern onto the respective inputs of said sensing means for each product term through selected conductive cells of said array, and means for propagating said apparent array pattern through said sensing means and said output logic circuitry in dependence on their operational state.

8. The invention of claim 7 wherein said verification means comprises:
serial shift register means comprising a plurality of serially-connected stages, each selectively coupled to the input of corresponding ones of said sensing means in response to control signals; and
means for loading said apparent array data pattern into the stages of said shift register means and thereafter coupling the data contents of the respective stages of the shift register means to the inputs of the corresponding sensing means for forcing the data content of the respective stage onto the respective inputs of the sensing means.

9. An integrated programmable logic device comprising:
a plurality of input lines;
a plurality of product terms;
output logic circuits coupling said product terms to device terminals;
a matrix of programmable cells each selectively coupling respective ones of said input lines to respective ones of said product terms, said cells comprising:
(i) an electrically erasable floating gate transistor having a source and a drain, and employing Fowler-Nordheim tunneling to achieve charge transfer between the floating gate and the transistor drain so that the transistor may be operated in either the enhancement mode or the depletion mode, whereby the transistor is either conductive or nonconductive when an interrogation signal is applied to the gate; and
(ii) a cell select transistor connected in series relation with said floating gate transistor and whose state is controlled by a respective input line signal; and
means for programming the floating gate transistors to either the enhancement mode or the depletion mode, said means adapted to program in parallel each of the cells coupled to a selected input line and comprising:
(i) a serial shift register means comprising a plurality of serially-connected stages coupled to corresponding product terms,
(ii) means for selectively coupling respective stages of said shift register means to each selected cell associated with a corresponding product term,
(iii) means for loading the stages of said shift register means with data corresponding to the state to which the cell is to be programmed, and
(iv) means for applying programming voltages to said floating gate transistors comprising said cells coupled to said selected input line in dependence on the state of said data in the respective stages of the shift register means.

10. The integrated programmable logic device of claim 9 wherein said output logic circuits comprise means for performing a logical OR function on the logical states of selected ones of the product terms.

11. An integrated programmable logic device comprising:
a plurality of input lines;
a plurality of product terms;
output logic circuits coupling said product terms to device terminals;
a matrix of programmable cells each selectively coupling respective ones of said input lines to respective ones of said product terms, said cells comprising:
(i) an electrically erasable floating gate transistor having a source and a drain and employing Fowler-Nordheim tunneling to achieve charge transfer between the floating gate and the transistor drain so that the transistor is either conductive or nonconductive when an interrogation signal is applied to the gate; and
(ii) a cell select transistor connected in series relation with said floating gate transistor and whose state is controlled by a respective input line signal; and
means for programming the floating gate transistors to either the conductive-when-interrogated state or the nonconductive-when-interrogated state, said means adapted to program in parallel each of the cells coupled to a selected input line and comprising:
(i) a serial shift register means comprising a plurality of serially-connected stages,
(ii) means for selectively coupling respective stages of said shift register means to each cell associated with a corresponding product term,
(iii) means for loading the stages of said shift register means with data corresponding to the state to which the cell is to be programmed, and
(iv) means for applying programming voltages to said floating gate transistors comprising said cells coupled to said selected input line in dependence on the state of said data in the respective stages of the shift register means.

12. The programmable logic device of claim 11 wherein said programming means comprises bulk erasing means for simultaneously programming each of the floating gate transistors comprising the cells to the enhancement mode.

13. The programmable logic device of claim 12 wherein said bulk erasing means comprises means for applying high programming potential to the gates of said floating gate transistor means, means for driving each of said select transistors to the conductive state, and means for grounding the respective drains of said floating gate transistors during a bulk erase cycle.

14. The integrated programmable logic device of claim 11 wherein said output logic circuits comprise means for performing a logical OR function on the logical states of selected ones of the product terms.

15. An integrated semiconductor programmable logic device comprising:
a plurality of input lines coupled to device input terminals;
a plurality of product terms;
a plurality of sensing means, one each coupled to a respective product term for sensing the logical state of said product term and providing a sense signal indicative of said logical state;
a plurality of output logic circuits responsive to said sense signals for providing device output signals at one or more device output terminals;
a plurality of electrically erasable and reprogrammable cells, each for selectively coupling respective ones of said input lines to respective ones of said product terms when the cell is in a conductive state and for isolating said input line from said product term when the cell is in a non-conductive state;

means for verifying the respective state of selected ones of said cells, said means comprising:

means for operatively selecting one of the cells coupled to each product term such that the logical state of said product term is dependent upon the state of said selected cell;

said sensing means; and means coupled to said sensing means for substantially simultaneously reading said sense signals and thereafter providing serial data representative of the states of the selected cells at a device external port.

16. The invention of claim 15 wherein said plurality of reprogrammable cells are arranged in a matrix of rows and columns, each of the respective cells in a given row is coupled to a corresponding input line, and each of the respective cells in a given column is coupled to a corresponding product term, and wherein said means for operatively selecting one of the cells coupled to each product term selects all cells disposed in a selected row.

17. The invention of claim 16 wherein said cells of said matrix each comprise first and second transistor means, said first transistor means adapted to select the cell for programming in dependence upon row address selection signals, and said second transistor is a floating gate transistor adapted to connect said input line to the corresponding product term when programmed to the conductive state, and to isolate said input line from the corresponding product term when programmed to the nonconductive state.

18. An integrated programmable logic device comprising:

a plurality of input lines;

a plurality of product terms;

a plurality of programmable cells each selectively coupling respective ones of said input lines to respective ones of said product terms in dependence on the programmed state of the respective cell and the logical state of the respective input line, said programmable cells each comprising:

(i) an electrically erasable and reprogrammable floating gate transistor having a source and a drain and employing Fowler-Nordheim tunneling to achieve charge transfer between the floating gate and the transistor drain so that the transistor is either conductive or nonconductive when an interrogation signal is applied to the gate of the transistor; and (ii) a cell select transistor connected in series relation with said floating gate transistor and whose state is controlled by a respective input line signal;

output logic circuits coupling said product terms to device output terminals to provide device output logical signals whose logical states depend on the logical states of the input lines, the programmed states of said cells and said output logic circuitry, and wherein said output logic circuits comprise means for performing a logical OR function on the logical states of selected ones of the product terms; and verification means for verifying the operation of said sensing means and said output logic circuitry.

19. An integrated semiconductor programmable logic device comprising:

a plurality of input lines coupled to device input terminals;

a plurality of product terms;

a plurality of output logic circuits coupling said respective product terms to device output terminals;

a plurality of electrically erasable and reprogrammable cells, each for selectively coupling respective ones of said input lines to respective ones of said product terms when the cell is in a conductive state and for isolating said input line from said product term when the cell is in a non-conductive state, said plurality of reprogrammable cells being arranged in a matrix of rows and columns with each of the respective cells in a given row coupled to a corresponding input line, and with each of the respective cells in a given column coupled to a corresponding product term;

means for verifying the respective state of selected ones of said cells, said means comprising:

means for operatively selecting all cells disposed in a selected row whose states are to be verified;

sensing means operatively coupled to said product terms for simultaneously sensing the state of the selected cell associated with each particular product term; and means selectively coupled to said sensing means for selectively reading said sensed states and thereafter providing data representative of the state of the selected cells at a device external port, said means comprising: a serial shift register comprising a plurality of serially-connected stages;

means for loading the respective stages of said shift register with data indicative of the sensed status of said respective selected cells; and means for shifting said data out of said shift register at an external device terminal.

20. An integrated semiconductor programmable logic device comprising:

a plurality of input lines coupled to device input terminals;

a plurality of product terms;

a plurality of output logic circuits coupling said respective product terms to device output terminals;

a plurality of electrically erasable and reprogrammable cells, each for selectively coupling respective ones of said input lines to respective ones of said product terms when the cell is in an conductive state and for isolating said input line from said product term when the cell is in a nonconductive state, said plurality of programmable cells being arranged in a matrix of rows and columns, with each of the respective cells in a given row coupled to a corresponding input line, and with each of the respective cells in a given column coupled to a corresponding product term;

means for verifying the respective state of selected ones of said cells, said means comprising:

means for operatively selecting all cells disposed in a selected row whose states are to be verified;

sensing means operatively coupled to said product terms for simultaneously sensing the state of the selected cell associated with each particular product term, said sensing means comprising a plurality of sense amplifiers, one each coupled to a respective product term for providing a sense amplifier logical state dependent on the logical states of those input lines selectively coupled to the respective product terms;

said selecting means operating so that the respective sense amplifier logical states are indicative of the states of one respective selected cell coupled to the respective product term; and means selectively coupled to said sensing means for selectively reading said sensed states and thereafter providing data representative of the state of the selected cells at a device external port; said means comprising:

a serial shift register latch (SRL) comprising a plurality of series-connected stages;

means for selectively coupling each stage of said SRL to the output of a corresponding sense amplifier for selectively loading the respective amplifier logical state into said register;

a serial data output terminal of said device coupled to the last stage of said SRL; and means for sequentially propagating the respective logical states loaded into the respective stages of said SRL through the SRL stages to said serial data output port.

21. The programmable logic device of claim 20 wherein said means for selectively coupling each stage of said SRL comprises a transistor switch gates by a verification signal.

22. The programmable logic device of claim 20 further comprising means for programming the respective cells coupled to each input line in accordance with a predetermined data pattern representing the desired conductive/nonconductive state of the respective cells, comprising:

a device serial data input port, a first register of said SRL being coupled to said input port;

means for serially propagating data representative of said predetermined data pattern into said SRL to load the registers of said SRL with said data pattern;

means for selectively coupling each stage of said SRL to each cell associated with a respective product term; and cell programming means for selectively programming the cells associated with the selected row and the respective product terms in dependence on the state of said programming data.

23. The programmable logic device of claim 22 wherein said programming means further comprises means for programming each of said programmable cells in said matrix to the nonconductive-when-interrogated state during a bulk erasing cycle, and wherein said cell programming means is adapted to program selected ones of the cells in the selected row to the conductive-when-interrogated state.

24. An improved integrated programmable logic device, comprising:

a plurality of input lines coupled to device input ports;

a matrix of programmable cells, each cell selectively coupling a particular input line to a respective product term;

a plurality of sense amplifiers, one each coupled to a respective product term for providing a sense amplifier logical state dependent on the logical states of those input lines selectively coupled to said respective product term;

output logic circuitry responsive to said respective sense amplifier logical states for providing device logical output signals at one or more device output terminals, said circuitry comprising means for performing a logical OR function on selected ones of said respective sense amplifier logical states;

programming means for parallel programming the respective cells coupled to a selected input line in accordance with a predetermined programming data pattern; and cell verification means for reading in parallel the programmed states of the respective cells coupled to a selected input line and providing a data sequence representative of respective programmed states at a device terminal.

25. An improved integrated programmable logic device, comprising:

a plurality of input lines;

a plurality of product term lines;

an array of nonvolatile electrically erasable and programmable switch elements, each coupled to a predetermined one of said input lines and said product term lines, and arranged to selectively couple said input line to said product term, or to isolate said input line from said product term, in dependence on the state of said switch element;

a plurality of sensing means, one each coupled to a respective one of said product terms, for sensing the logical state of said product term and providing a logical sense signal indicative of said logical state;

output logic circuitry responsive to said respective logical sense signals for providing device logic output signals at one or more device terminals, said circuitry comprising means for performing a logical OR function on selected ones of said respective sense amplifier logical signals; and verification means for verifying the operation of said sensing means and said output logic circuitry.

* * * * *